(12) United States Patent
Lee

(10) Patent No.: US 10,937,805 B1
(45) Date of Patent: Mar. 2, 2021

(54) SEMICONDUCTOR MEMORY DEVICE

(71) Applicant: SK hynix Inc., Icheon-si (KR)

(72) Inventor: Nam Jae Lee, Cheongju-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/794,415

(22) Filed: Feb. 19, 2020

(30) Foreign Application Priority Data

Aug. 6, 2019 (KR) .......................... 10-2019-0095710

(51) Int. Cl.
| | |
|---|---|
| *H01L 27/11* | (2006.01) |
| *H01L 27/11582* | (2017.01) |
| *H01L 23/528* | (2006.01) |
| *H01L 27/11573* | (2017.01) |
| *G11C 16/30* | (2006.01) |
| *H01L 27/11575* | (2017.01) |
| *G11C 16/04* | (2006.01) |
| *G11C 16/14* | (2006.01) |
| *H01L 27/11556* | (2017.01) |
| *H01L 27/11526* | (2017.01) |
| *H01L 27/11548* | (2017.01) |

(52) U.S. Cl.
CPC .... *H01L 27/11582* (2013.01); *G11C 16/0483* (2013.01); *G11C 16/14* (2013.01); *G11C 16/30* (2013.01); *H01L 23/5283* (2013.01); *H01L 27/11573* (2013.01); *H01L 27/11575* (2013.01); *H01L 27/11526* (2013.01); *H01L 27/11548* (2013.01); *H01L 27/11556* (2013.01)

(58) Field of Classification Search
None
See application file for complete search history.

(56) References Cited

U.S. PATENT DOCUMENTS

| | | | | |
|---|---|---|---|---|
| 2013/0258752 | A1* | 10/2013 | Park ................... | G11C 13/0002 365/148 |
| 2017/0040338 | A1* | 2/2017 | Lee ................... | H01L 27/11582 |
| 2017/0103999 | A1* | 4/2017 | Lee ................... | H01L 27/11582 |
| 2017/0162578 | A1* | 6/2017 | Noh ................... | H01L 27/11582 |
| 2019/0057741 | A1 | 2/2019 | Ogawa et al. | |

FOREIGN PATENT DOCUMENTS

KR     1020160094117 A     8/2016

* cited by examiner

*Primary Examiner* — Tan T. Nguyen
(74) *Attorney, Agent, or Firm* — William Park & Associates Ltd.

(57) ABSTRACT

A semiconductor memory device includes a memory cell array and bit lines connected to the memory cell array. The semiconductor memory device also includes a first upper line and a second upper line which overlap with the bit lines and are spaced apart from the bit lines by different distances.

16 Claims, 13 Drawing Sheets

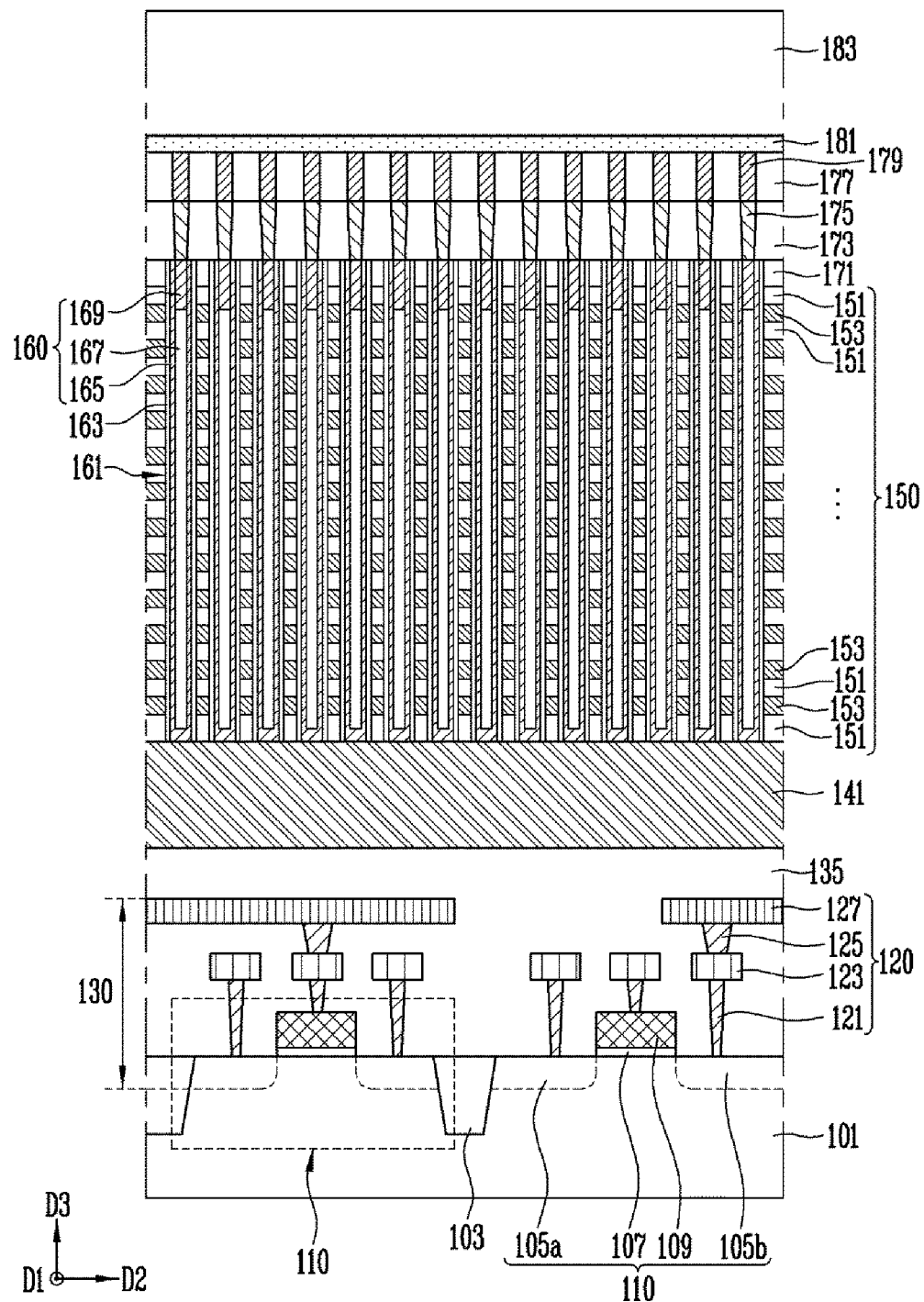

US 10,937,805 B1

SEMICONDUCTOR MEMORY DEVICE

CROSS-REFERENCE TO RELATED APPLICATION

The present application claims priority under 35 U.S.C. § 119(a) to Korean patent application number 10-2019-0095710 filed on Aug. 6, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

Semiconductor memory devices include memory cells capable of storing data. In order to improve the degree of integration of memory cells, three-dimensional semiconductor memory devices have been proposed.

Three-dimensional semiconductor memory devices may include a plurality of memory cells connected in series by a channel structure extending in a vertical direction. Data stored in the memory cells of three-dimensional semiconductor memory devices may be erased through a Gate Induced Drain Leakage (GIDL) erase operation of generating holes by using a GIDL current.

SUMMARY

In accordance with an embodiment of the present disclosure, a semiconductor memory device includes a common source line formed on a substrate, a memory cell array formed on the common source line, bit lines connected to the memory cell array, and an insulating layer extending to overlap with the bit lines. The insulating layer includes a first region and a second region, wherein a thickness of the insulating layer in the first region is thinner than a thickness of the insulating layer in the second region. The semiconductor memory device also includes a first upper line overlapping with the first region of the insulating layer and a second upper line overlapping with the second region of the insulating layer.

In accordance with another embodiment of the present disclosure, a semiconductor memory device includes a common source line formed on a substrate, a memory cell array formed on the common source line, bit lines connected to the memory cell array, an insulating layer extending to overlap with the bit lines, a first upper line formed on the insulating layer, and a second upper line formed on the insulating layer. The second upper line is spaced farther apart from the bit lines than the first upper line.

BRIEF DESCRIPTION OF THE DRAWINGS

FIGS. 6A to 6D are sectional views illustrating a manufacturing method of a semiconductor memory device in accordance with an embodiment of the present disclosure.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Various embodiments provide for semiconductor memory devices capable of improving erase efficiency.

Figure 1:
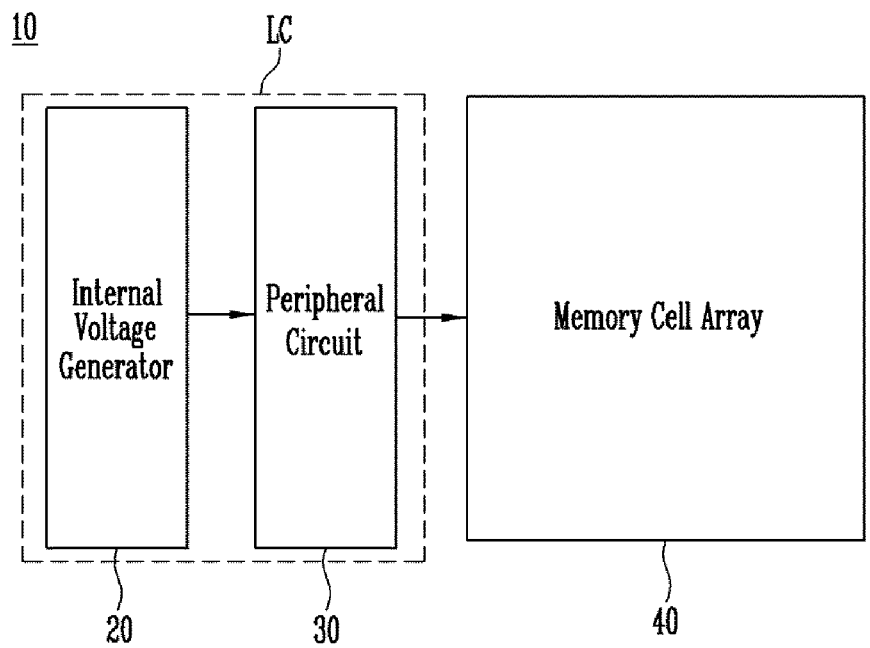
FIGS. 1 and 2 are block diagrams illustrating a semiconductor memory device in accordance with an embodiment of the present disclosure.
Figure 2:
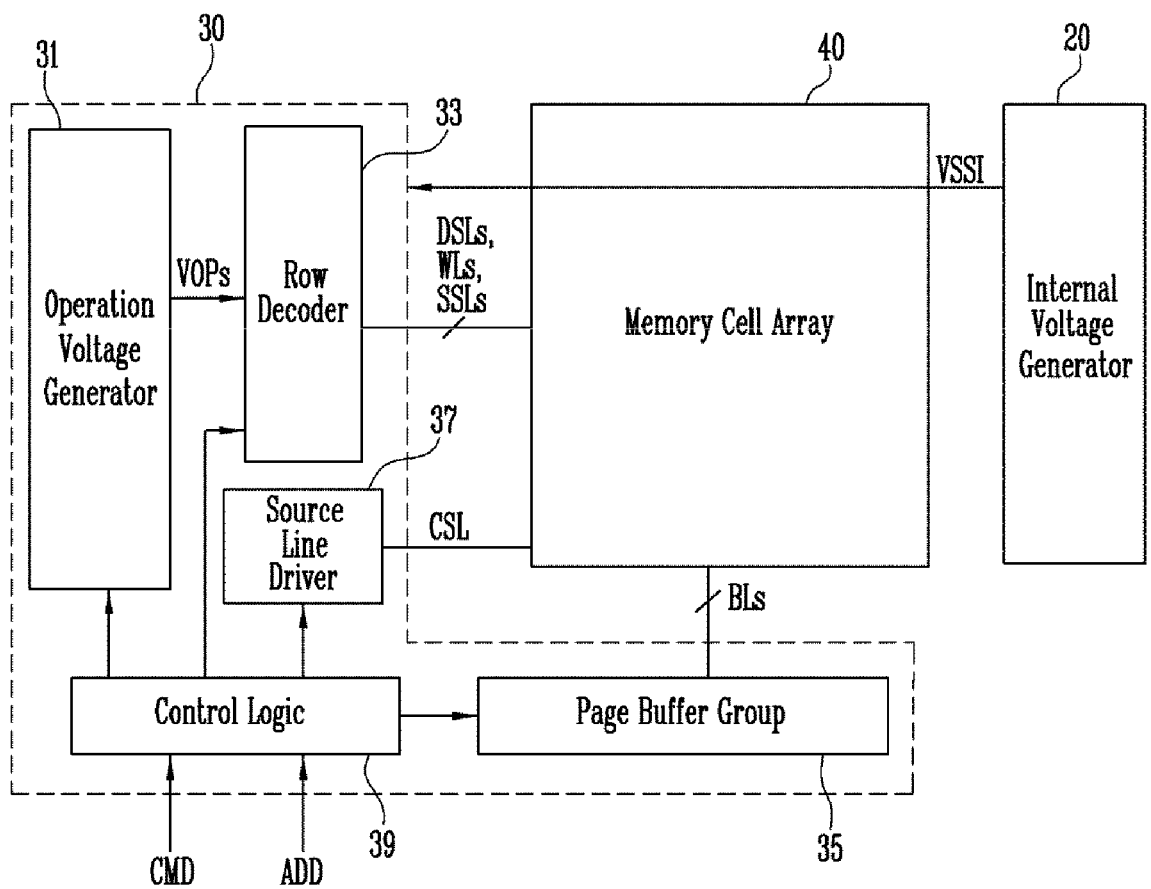

FIGS. 1 and 2 are block diagrams illustrating a semiconductor memory device 10 in accordance with an embodiment of the present disclosure.

FIG. 1 is a block diagram schematically illustrating the semiconductor memory device 10.

Referring to FIG. 1, the semiconductor memory device 10 includes a logic circuit LC and a memory cell array 40. The logic circuit LC may include an internal voltage generator 20 and a peripheral circuit 30.

The internal voltage generator 20 may generate various internal voltages by receiving an external voltage. In an embodiment, the internal voltages may include an internal ground voltage and an internal power voltage.

The peripheral circuit 30 may perform a program operation for storing data in the memory cell array, a read operation for outputting data stored in the memory cell array 40, and an erase operation for erasing data stored in the memory cell array 40. Internal voltages required to activate the peripheral circuit 30 may be generated from the internal voltage generator 20 to be supplied to the peripheral circuit 30.

FIG. 2 is a block diagram illustrating an embodiment of the peripheral circuit 30 shown in FIG. 1.

Referring to FIG. 2, the peripheral circuit 30 may include control logic 39, an operation voltage generator 31, a row decoder 33, a source line driver 37, and a page buffer group 35.

The memory cell array 40 may include a plurality of memory blocks. Each of the memory blocks may be connected to one or more drain select lines DSLs, a plurality of word lines WLs, one or more source select lines SSLs, a plurality of bit lines BLs, and at least one common source line CSL.

The control logic 39 may control the peripheral circuit 30 in response to a command CMD and an address ADD. The control logic 39 may be implemented as hardware, software, or a combination of hardware and software. For example, the control logic 39 may be a control logic circuit operating in accordance with an algorithm and/or a processor executing control logic code.

The operation voltage generator 31 may generate various operation voltages VOPs used for a program operation, a read operation, and an erase operation under the control of the control logic 39. The operation voltages VOPs may include a program voltage, a verify voltage, a pass voltage, a select line voltage, and the like.

The row decoder 33 may select a memory block under the control of the control logic 39. The row decoder 33 may apply operation voltages VOPs to the drain select lines DSLs, the word lines WLs, and the source select lines SSLs, which are connected to the selected memory block.

The source line driver 37 may be connected to the memory cell array 40 through the common source line CSL. The source line driver 37 may perform a discharge operation of the common source line CSL under the control of the control logic 39. The source line driver 37 may apply a pre-erase voltage and an erase voltage to the common source line CSL in an erase operation under the control of the control logic 39.

The page buffer group 35 may be connected to the memory cell array 40 through the bit lines BLs. The page buffer group 35 may temporarily store data to be programmed, which is received from an input/output circuit (not shown), in a program operation under the control of the control logic 39. The page buffer group 35 may sense voltages or currents of the bit lines BLs in a read operation or verify operation under the control of the control logic 39. The page buffer group 35 may selectively float the bit lines BLs under the control of the control logic 39.

Internal voltages output from the internal voltage generator 20 may be supplied to the peripheral circuit 30. In an embodiment, an internal ground voltage VSSI may be output from the internal voltage generator 20. The internal ground voltage VSSI may be supplied to the peripheral circuit 30 via a line overlapping with the memory cell array 40.

Figure 3:
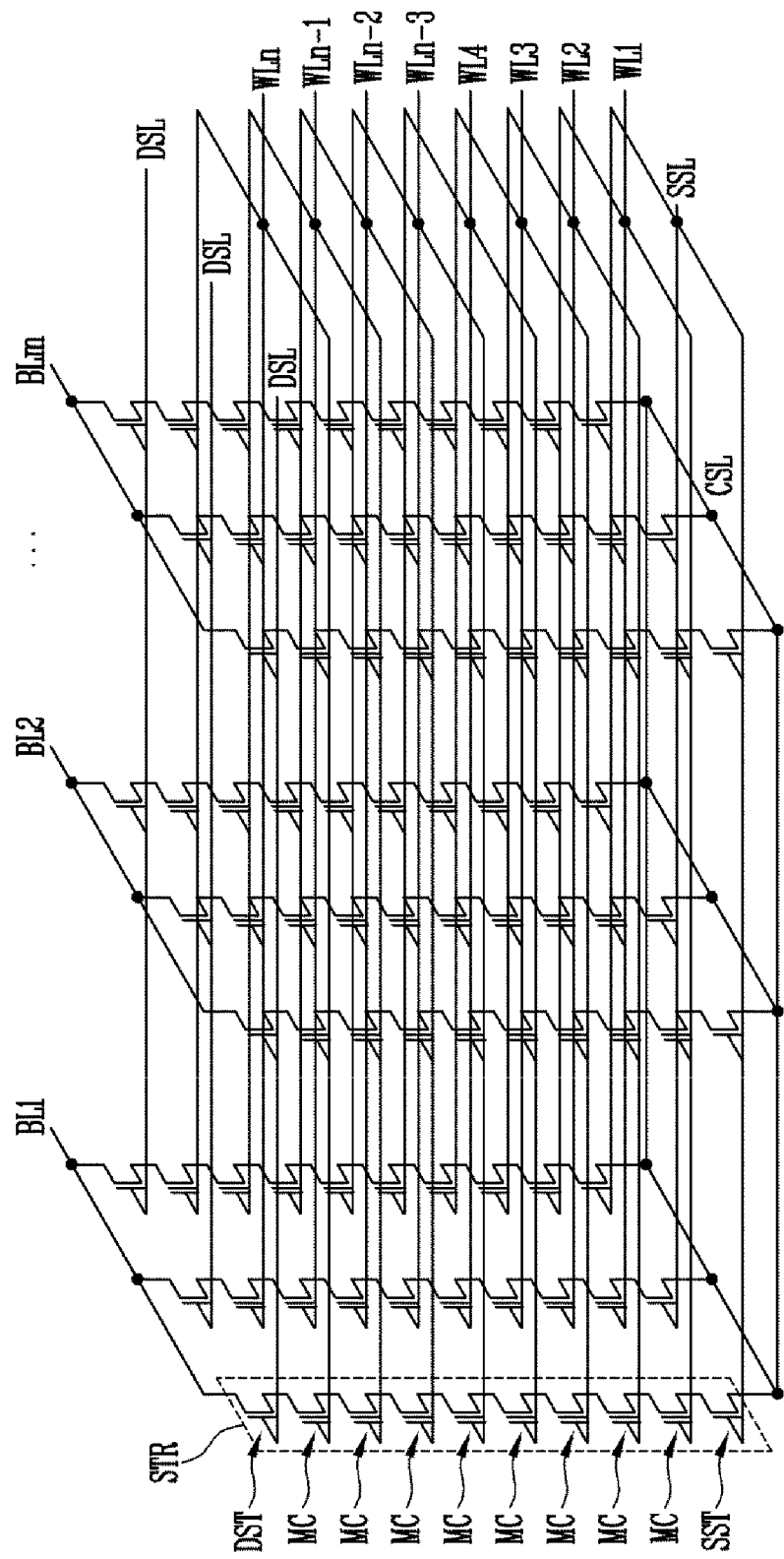
FIG. 3 is an equivalent circuit diagram illustrating a memory block in accordance with an embodiment of the present disclosure.

FIG. 3 is an equivalent circuit diagram illustrating a memory block in accordance with an embodiment of the present disclosure.

Referring to FIG. 3, the memory block may include a plurality of memory cell strings STR commonly connected to a common source line CSL. The memory cell strings STR may be connected to a plurality of bit lines BL1 to BLm. The memory cell strings STR may be divided into a plurality of column groups respectively connected to the bit lines BL1 to BLm. Memory cell strings STR of each column group may be connected in parallel to a bit line corresponding thereto.

Each of the memory cell strings STR may include one or more drain select transistors, a plurality of memory cells, and one or more source select transistors, which are disposed between a bit line corresponding thereto and the common source line CSL. A gate of each of the drain select transistors may be connected to a drain select line corresponding thereto, a gate of each of the memory cells may be connected to a word line corresponding thereto, and a gate of each of the source select transistors may be connected to a source select line corresponding thereto.

In an embodiment, each of the memory cell strings STR may be connected to a drain select line DSL, a plurality of word lines WL1 to WLn, and a source select line SSL. Each of the memory cell strings STR may include a drain select transistor DST connected to a drain select line DSL, memory cells MC connected to the word lines WL1 to WLn, and a source select transistor SST connected to the source select line SSL.

A plurality of memory cells MC may be connected in series. A drain select transistor DST may be disposed between the plurality of memory cells MC and a bit line corresponding thereto. The drain select transistor DST may include a junction region connected to a bit line corresponding thereto. A source select transistor SST may be disposed between the plurality of memory cells MC and the common source line CSL. The source select transistor SST may include a junction region connected to the common source line CSL.

The structure of each of the memory cell strings STR is not limited to the embodiment shown in FIG. 3. In an embodiment, each of the memory cell strings STR may include two or more drain select transistors that are disposed between a plurality of memory cells MC connected in series and a bit line corresponding thereto and are connected in series. Two or more drain select lines may be disposed between the bit lines BL1 to BLm and the word lines WL1 to WLn. In an embodiment, each of the memory cell strings STR may include two or more source select transistors that are disposed between a plurality of memory cells MC connected in series and the common source line CSL and are connected in series. Two or more source select lines may be disposed between the common source line CSL and the word lines WL1 to WLn.

In an embodiment, at least one of the word lines WL1 to WLn may be used as a dummy word line. For example, at least one of a word line WL1 adjacent to the source select line SSL and a word line WLn adjacent to the drain select line DSL may be used as a dummy word line.

An erase operation of the semiconductor memory device may include a hot hole forming period and an erase period.

Referring to FIGS. 2 and 3, during the hot hole forming period of the erase operation, the row decoder 33 may control the word lines WL1 to WLn of a selected memory block to be in a floating state, and the page buffer group 35 may control the bit lines BL1 to BLm of the selected memory block to be in a floating state.

During the hot hole forming period of the erase operation, the operation voltage generator 31 may apply a pre-erase voltage for generating a Gate Induced Drain Leakage (GIDL) current to the common source line CSL. When a voltage level of the source select line SSL is low, a GIDL current may be generated between the source select line SSL and the junction region of the source select transistor SST. In an embodiment, during the hot hole forming period of the erase operation, the row decoder 33 may control the source select line SSL to have a ground voltage level.

When a GIDL current is generated, hot holes may be generated. The generated hot holes may be injected into a channel region of the memory cell string STR. Accordingly, a channel voltage of the memory cell string STR may be increased.

Subsequently, during the erase period of the erase operation, the operation voltage generator 31 may apply an erase voltage higher than the pre-erase voltage to the common source line CSL. As a result, the channel voltage of the memory cell string STR is increased.

During the erase period of the erase operation, the row decoder 33 may control the source select line SSL to be in a floating state, and control the word lines WL1 to WLn to have a ground voltage level. Accordingly, data stored in the memory cells MC may be erased due to a voltage difference between the channel region of the memory cell string STR having the increased potential level and the word lines WL1 to WLn having the ground voltage level.

The erase operation may be ended when the source select transistor SST is turned off by controlling the source select line SSL to have the ground voltage level through the row decoder 33.

In an embodiment, in order to improve the efficiency of the above-described GIDL erase operation, during the erase operation, the voltage applied to the common source line CSL may be applied to the bit lines BL1 to BLm, and a voltage applied to the source select line SSL may be applied to the drain select line DSL. Accordingly, during the erase operation, a GIDL current is generated between the drain select line DSL and the junction region of the drain select transistor DST, so that erase efficiency can be improved.

In an embodiment, a high voltage for the erase operation may be applied to the bit lines BL1 to BLm through capacitive coupling between a line for applying an erase voltage to the common source line CSL and the bit lines BL1 to BLm. Accordingly, the erase efficiency can be improved without separately provide the page buffer group 35 shown in FIG. 2 with high voltage transistors for applying a high voltage such as an erase voltage to the bit lines BL1 to BLm. Thus, when a high voltage for erasing is applied to the bit lines BL1 to BLm by using the capacitive coupling, the semiconductor memory device can be highly integrated.

In embodiments of the present disclosure, some of lines connected to the logic circuit may overlap with the memory cell array so as to use the capacitive coupling during the erase operation and highly integrate the semiconductor memory device.

Figure 4:
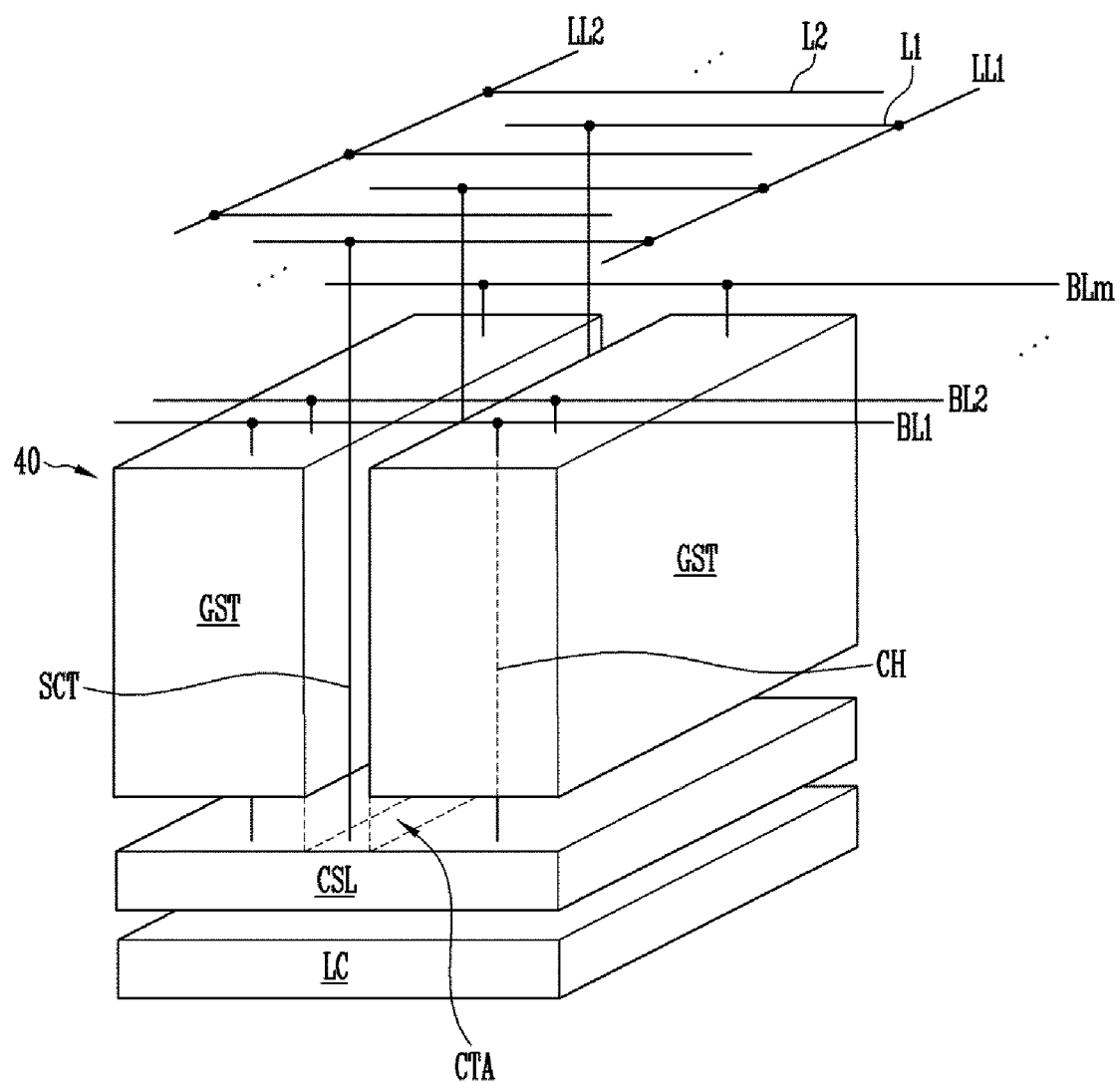
FIG. 4 is a view illustrating an embodiment of first upper lines and second upper lines, which overlap with a memory cell array.

FIG. 4 is a view illustrating an embodiment of first upper lines and second upper lines, which overlap with the memory cell array.

Referring to FIG. 4, the memory cell array 40 may be disposed between a common source line CSL and the bit lines BL1 to BLm. The memory cell array 40 may include gate stack structures GST and channel structures CH each penetrating the gate stack structures GST.

The gate stack structures GST may be spaced apart from each other. FIG. 4 illustrates two gate stack structures GST spaced apart from each other with a conductive source contact structure SCT interposed therebetween. The memory cell array 40 may include three or more gate stack structures GST spaced apart from each other, in addition to the structure shown in FIG. 4.

Each of the channel structures CH may include one end connected to the common source line CSL and the other end connected to a bit line corresponding thereto among the bit line BL1 to BLm. Each of the channel structures CH and the common source line CSL may be directly connected to each other. Alternatively, a lower channel structure or contact structure for connecting each of the channel structures CH and the common source line CSL may be formed between each of the channel structures CH and the common source line CSL. Each of the channel structure CH and a bit line corresponding thereto may be directly connected to each other. Alternatively, a contact structure for connecting each of the channel structures CH and the corresponding bit line may be formed between each of the channel structures CH and the corresponding bit line.

The channel structures CH may be arranged in a zigzag or matrix form in a gate stack structure corresponding thereto.

The common source line CSL may be formed above a substrate including a logic circuit LC. The common source line CSL may include a contact region CTA that does not overlap with the gate stack structures GST. In an embodiment, the contact region CTA of the common source line CSL may be disposed between the gate stack structures GST adjacent to each other. The source contact structure CST may extend toward a first upper line L1 among first upper lines L1 from the contact area CTA of the common source line CSL.

The first upper lines L1 may be alternately arranged with second upper lines L2. The first upper lines L1 may be formed of the same conductive material as the second upper lines L2. Each of the first upper lines L1 and the second upper lines L2 may be spaced apart from the bit lines BL1 to BLm and overlap with the bit lines BL1 to BLm. In an embodiment, each of the first upper lines L1 and the second upper lines L2 may extend in a straight line shape along the extending direction of the bit lines BL1 to BLm. In an embodiment, each of the first upper lines L1 and the second upper lines L2 may extend in a zigzag form along the extending direction of the bit lines BL1 to BLm.

The first upper lines L1 may be connected to each other by a first connection line LL1. The first connection line LL1 may intersect with the first upper lines L1. In an embodiment, the first upper lines L1 and the first connection line LL1 may be portions of a net-shaped line overlapping with the memory cell array 40 above the memory cell array 40. The first upper lines L1 and the first connection line LL1 may be used to connect the common source line CSL to the source line driver 37 shown in FIG. 2. Accordingly, a potential level of the common source line CSL may be discharged through the source line driver 37 shown in FIG. 2 via the first upper lines L1. In addition, the pre-erase voltage and the erase voltage, which are provided through the source line driver 37 shown in FIG. 2 during the erase operation, may be transmitted to the common source line CSL via the first upper lines L1.

The second upper lines L2 may be connected to each other by a second connection line LL2. The second connection line LL2 may intersect with the second upper lines L2. The second upper lines L2 and the second connection line LL2 may be used to connect the internal voltage generator 20 shown in FIG. 2 to the peripheral circuit 30 shown in FIG. 2. Accordingly, the second upper lines L2 may transmit the internal ground voltage VSSI output from the internal voltage generator 20 described with reference to FIG. 2 to the peripheral circuit 30.

The first connection line LL1, the second connection line LL2, the first upper lines L1, and the second upper lines L2 may include a low-resistance metal. For example, the first connection line LL1, the second connection line LL2, the first upper lines L1, and the second upper lines L2 may include a metal such as copper or aluminum.

Each of the first upper lines L1 and the second upper lines L2 may be formed to have a width wider than that of each of the bit lines BL1 to BLm. Accordingly, each of the first upper lines L1 and the second upper lines L2 may overlap with two or more bit lines.

FIGS. 5A to 5D are views illustrating a semiconductor memory device in accordance with an embodiment of the present disclosure. In the following drawings, a first direction D1 represents an extending direction of bit lines, and a second direction D2 represents a direction intersecting the bit lines. In an embodiment, a line extending along the first direction D1 and a line extending along the second direction D2 may be orthogonal to each other. A third direction D3 represents a vertical direction orthogonal to a horizontal plane extending in the first direction D1 and the second direction D2.

Figure 5A:
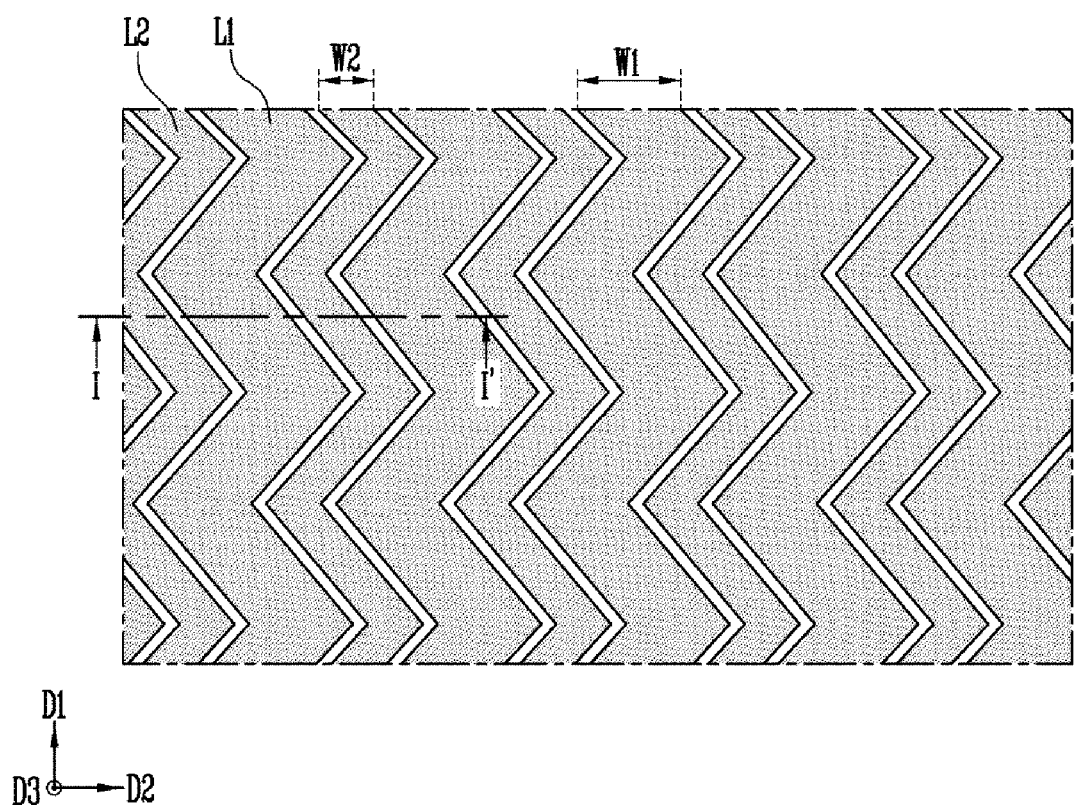
FIGS. 5A to 5D are views illustrating a semiconductor memory device in accordance with an embodiment of the present disclosure.

FIG. 5A illustrates an embodiment of a layout of the first upper lines L1 and the second upper lines L2, which are shown in FIG. 4.

Referring to FIG. 5A, each of the first upper lines L1 and the second upper lines L2 may extend in a zigzag form along the first direction D1. When the first upper lines L1 and the second upper lines L2 extend in the zigzag form, noise caused by the first upper lines L1 and the second upper lines L2 may be decreased. However, the present disclosure is not limited thereto. In an embodiment, each of the first upper lines L1 and the second upper lines L2 may extend in a straight line shape along the first direction D1.

Each of the first upper lines L1 may be formed to have a first width W1 in the second direction D2, and each of the second upper lines L2 may be formed to have a second width W2 in the second direction D2. The first width W1 may be formed wider than the second width W2.

Figure 5B:
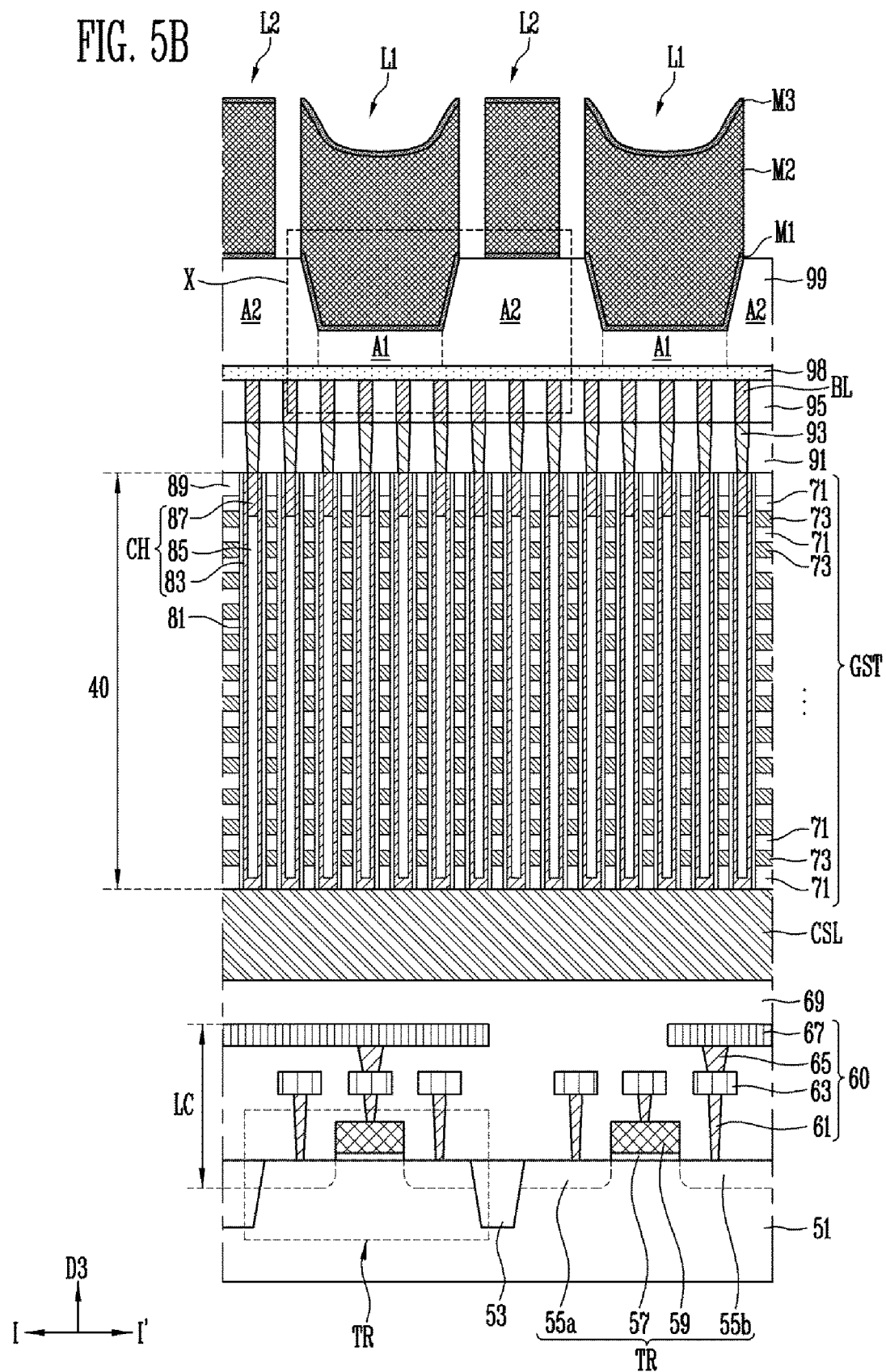

FIG. 5B illustrates a section of the semiconductor memory device taken along line I-I' shown in FIG. 5A. The line I-I' extends in the second direction D2.

Referring to FIG. 5B, a common source line CSL may be formed on a substrate 51. The substrate 51 may include the logic circuit LC described with reference to FIG. 2.

The substrate 51 may be a bulk silicon substrate, a silicon-on-insulator substrate, a germanium substrate, a germanium-on-insulator substrate, a silicon-germanium substrate, or an epitaxial thin film formed through a selective epitaxial growth process.

The common source line CSL may overlap with transistors TR of the logic circuit LC. Each of the transistors TR may be formed in an active region of the substrate 51, which is defined by an isolation layer 53. Each of the transistors TR may include a gate insulating layer 57 and a gate electrode 59, which are stacked on an active region corresponding thereto, and include junction regions 55a and 55b formed in the active region at both sides of the gate electrode 59. One of the junction regions 55a and 55b may be used as a source region, and the other of the junction regions 55a and 55b may be used as a drain region.

The logic circuit LC may include interconnection structures 60 connected to the transistors TR constituting the logic circuit LC. Each of the interconnection structures 60 may include multi-layered conductive patterns 61, 63, 65, and 67. The configuration of the interconnection structures 60 is not limited to that shown in the drawing, and may be variously modified.

The substrate 51 including the logic circuit LC may be covered by an insulating structure 69. The insulating structure 69 may include two or more multi-layered insulating layers. The common source line CSL may be disposed on the insulating structure 69.

A memory cell array 40 may be disposed on the common source line CSL. A gate stack structure GST of the memory cell array 40 may include interlayer insulating layers 71 and conductive patterns 73, which are alternately stacked on the common source line CSL. The conductive patterns 73 may be used as the source select line SSL, the word lines WL1 to WLn, and the drain select line DSL, which are described with reference to FIG. 3. In an embodiment, at least one lower conductive pattern disposed adjacent to the common source line CSL among the conductive patterns 73 may be used as the source select line SSL described with reference to FIG. 3. In an embodiment, at least one upper conductive pattern disposed adjacent to bit lines BL among the conductive patterns 73 may be used as the drain select line DSL described with reference to FIG. 3. Intermediate conductive patterns between the lower conductive pattern and the upper conductive pattern among the conductive patterns 73 may be used as the word lines WL1 to WLn described with reference to FIG. 3.

Channel structures CH of the memory cell array 40 may penetrate a gate stack structure GST corresponding thereto. The memory cell array 40 may be connected to the common source line CSL by the channel structures CH. A memory layer 81 may be disposed between each of the channel structure CH and the gate stack structure GST. The memory layer 81 may extend along a sidewall of each of the channel structures CH.

Figure 5C:
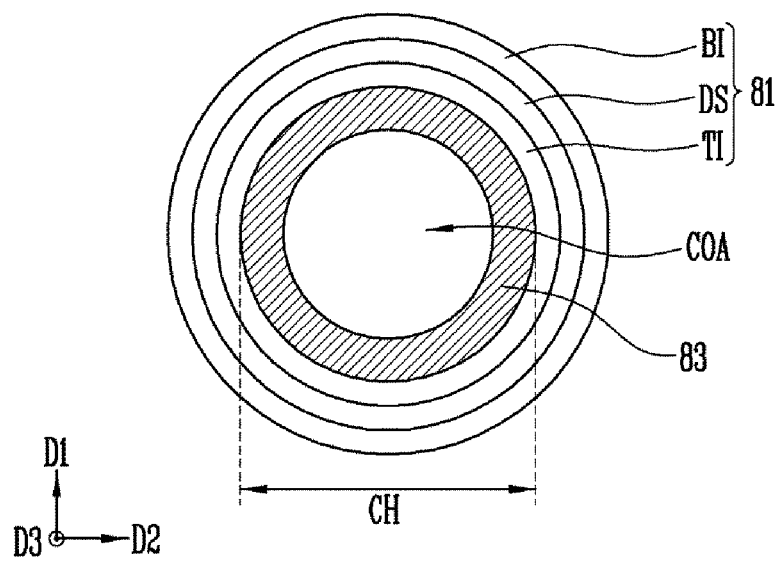

FIG. 5C is an enlarged cross-sectional view illustrating one of the channel structures CH and a memory layer 81 surrounding the same.

Referring to FIG. 5C, the memory layer 81 may surround the sidewall of a channel structure CH corresponding thereto. The memory layer 81 may include a tunnel insulating layer TI, a data storage layer DS, and a blocking insulating layer BI, which are stacked on the sidewall of the corresponding channel structure CH. The tunnel insulating layer TI may include silicon oxide through which charges can tunnel. The data storage layer DS may be formed of a charge trapping layer. For example, the charge trapping layer may include silicon nitride. The blocking insulating layer BI may include an oxide capable of blocking charges. The data storage layer DS may be formed of various materials in addition to the charge trapping layer. For example, the data storage layer DS may be formed of a material layer including conductive nano dots, be formed of a phase change material layer, or be formed of a material layer for floating gates. The data storage layer DS may be formed in various forms between the tunnel insulating layer TI and the blocking insulating layer BI according to the structure of a cell to be implemented.

Referring to FIGS. 5B and 5C, the channel structure CH may include a channel layer 83. In an embodiment, the channel structure CH may include a central region COA surrounded by the channel layer 83. The channel structure CH may further include a core insulating layer 85 and a doped semiconductor layer 87, which fill the central region COA of the channel structure CH. The doped semiconductor layer 87 may be disposed between a bit line BL corresponding thereto among the bit lines BL and the core insulating layer 85.

The channel structure CH is not limited to the example shown in the drawings. For example, the channel structure CH may include an embedded type channel layer embedded in the central region COA of the channel structure CH, and the core insulating layer 85 may be omitted.

The channel layer 83 may be used as a channel region of a memory cell string corresponding thereto. The channel layer 83 may be formed of a semiconductor material. In an embodiment, the channel layer 83 may include a silicon layer.

Referring to FIG. 5B, one end of the channel structure CH, which faces the common source line CSL, may be connected to the common source line CSL. In an embodiment, a portion of the channel layer 83, which constitutes the one end of the channel structure CH, may be directly connected to the common source line CSL.

The other end of the channel structure CH, which faces a bit line BL corresponding thereto among the bit lines BL, may be connected to the corresponding bit line BL via a contact plug 93 formed of a conductive material. In an embodiment, the doped semiconductor layer 87 constituting the other end of the channel structure CH may be directly connected to the contact plug 93.

Conductivity type dopants may be distributed in a portion of the channel layer 83, which constitutes the other end of the channel structure CH, and in the doped semiconductor layer 87. The conductivity type dopants may include an n-type dopant for junctions. The conductivity type dopants may include a counter-doped p-type dopant.

According to the above-described structure, the memory cells MC described with reference to FIG. 3 may be defined at intersection portions of the intermediate conductive patterns used as the word lines among the conductive patterns 73 and the channel structure CH. The source select transistor SST described with reference to FIG. 3 may be defined at an intersection portion of the lower conductive pattern used as the source select line among the conductive patterns 73. The drain select transistor DST described with reference to FIG. 3 may be defined at an intersection portion of the upper conductive pattern used as the drain select line among the conductive patterns 73. The source select transistor SST, the memory cells MC, and the drain select transistor SST, which are described with reference to FIG. 3, may be connected in series by the channel structure CH described with reference to FIG. 5B, to constitute the memory cell string STR described with reference to FIG. 3.

The gate stack structure GST of the memory cell array 40 may be covered by a first upper insulating layer 89. The channel structures CH may extend to penetrate the first upper insulating layer 89.

The bit lines BL may be connected to the memory cell array 40 through the channel structures CH. Each of the bit lines BL may be connected to a channel structure corresponding thereto via a contact plug 93 corresponding thereto. The contact plug 93 may be disposed in a second upper insulating layer 91 disposed on the first upper insulating layer 89. The bit lines BL may be disposed in a third upper insulating layer 95 disposed on the second upper insulating layer 91. The bit lines BL and the contact plug 93 may be formed of various conductive materials.

The bit lines BL shown in FIG. 5B may be included in the bit lines BL1 to BLm shown in FIG. 4. The third upper insulating layer 95 penetrated by the bit lines BL may be covered by a fourth upper insulating layer 99. An etch stop layer 98 may be further formed between the fourth upper insulating layer 99 and the third upper insulating layer 95. Each of the first to fourth upper insulating layers 89, 91, 95, and 99 may include an oxide, and the etch stop layer 98 may include a nitride.

The fourth upper insulating layer 99 may extend to overlap with the bit lines BL. First upper lines L1 and second upper lines L2 may be disposed on the fourth upper insulating layer 99. The first upper lines L1 and the second upper line L2 may overlap with the bit lines BL, and be spaced apart from the bit lines BL by the fourth upper insulating layer 99.

The fourth upper insulating layer 99 may include first regions A1 overlapping with the first upper lines L1 and second regions A2 overlapping with the second upper lines L2. The first regions A1 and the second regions A2 may be alternately disposed. The third upper insulating layer 95 and the fourth upper insulating layer 99 may extend to overlap with the contact region CTA of the common source line CSL described with reference to FIG. 4. The third upper insulating layer 95 and the fourth upper insulating layer 99 may be penetrated by the source contact structure SCT described with reference to FIG. 4, and at least one of the first upper lines L1 may be connected to the source contact structure SCT described with reference to FIG. 4.

Each of the first upper lines L1 and the second upper lines L2 may be formed of various conductive materials. In an embodiment, each of the first upper lines L1 and the second upper lines L2 may include a metal layer M2 having a low resistance. Copper or aluminum may be used as the metal layer M2 having the low resistance. Each of the first upper lines L1 and the second upper lines L2 may further include at least one of a conductive barrier layer M1 disposed between the metal layer M2 and the fourth upper insulating layer 99 and a conductive Anti-Reflective Coating (ARC) layer M3 remaining on the fourth upper insulating layer 99. Each of the barrier layer M1 and the ARC layer M3 may be formed of various conductive materials such as a titanium nitride layer (TiN).

The first upper lines L1 may be used as lines connecting the source line driver 37 and the common source line CSL, which are shown in FIG. 2, to each other. The second upper lines L2 may be used as lines connecting the internal voltage generator 20 and the peripheral circuit 30, which are shown in FIG. 2, to each other.

During an erase operation, the first upper lines L1 transmitting an erase voltage may transmit a high voltage to the bit lines BL overlapping the first upper lines L1 by using capacitive coupling. The thickness of the fourth upper insulating layer 99 may be partially decreased such that capacitance between the first upper lines L1 and the bit lines BL can be increased.

Figure 5D:
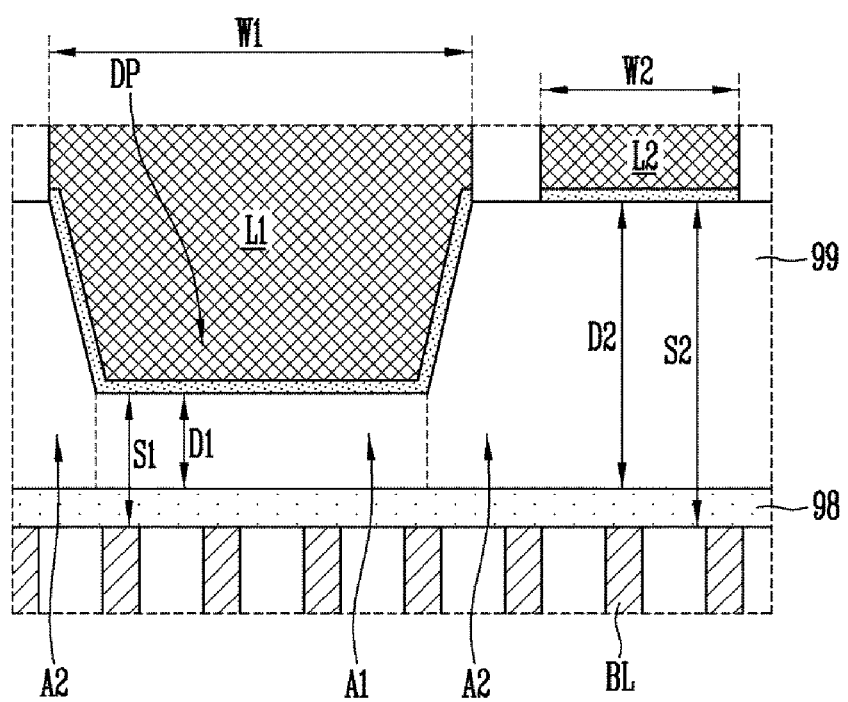

FIG. 5D is an enlarged view of region X shown in FIG. 5B.

Referring to FIG. 5D, the first region A1 of the fourth upper insulating layer 99, which overlaps with the first upper line L1, may have a first thickness D1, and the second region A2 of the fourth upper insulating layer 99, which overlaps with the second upper line L2, may have a second thickness D2. The first thickness D1 may be formed thinner than the second thickness D2. A surface of the fourth upper insulating layer 99 may have a depression part DP and a protrusion part. The second region A2 of the fourth upper insulating layer 99 may be defined as the protrusion part supporting the second upper line L2, and the depression part DP into which the first upper line L1 is inserted may be defined between adjacent second regions A2.

According to the above-described structure, the second upper line L2 may be disposed more distant from the bit lines BL than the first upper line L1. In other words, a second distance S2 between the second upper line L2 and a bit line BL overlapping therewith may be defined greater than a first distance S1 between the first upper line L1 and a bit line BL overlapping therewith.

In accordance with an embodiment of the present disclosure, capacitance between the first upper line L1 and the bit lines BL may be increased, and capacitance between the second upper line L2 and the bit lines BL may be decreased. Accordingly, erase efficiency can be improved using capacitive coupling between the first upper line L1 and the bit lines BL during the erase operation, and noise of the bit lines BL, which is caused by the second upper line L2, can be reduced.

In an embodiment of the present disclosure, the first width W1 of the first upper line L1 may be formed wider than the second width W2 of the second upper line L2. Accordingly, noise caused by the second upper line L2 can be reduced, and erase efficiency can be improved using capacitive coupling between the first upper line L1 and the bit lines BL during the erase operation.

In accordance with an embodiment of the present disclosure, a portion of the first upper line L1 may be inserted into the depression part DP. Accordingly, a partial side surface of the first upper line L1 does not face the second upper line L2, and thus noise between the first upper line L1 and the second upper line L2 can be reduced.

In accordance with the embodiment of the present disclosure, the second upper line L2 for transmitting the internal ground voltage VSSI described with reference FIG. 2 overlaps with the memory cell array, so that the degree of integration of the semiconductor memory device can be improved. In addition, a signal transmitted by the second upper line L2 overlapping with the memory cell array is the internal ground voltage VSSI, so that noise caused by the second upper line L2 can be reduced.

FIGS. 6A to 6D are sectional views illustrating a manufacturing method of the semiconductor memory device in accordance with an embodiment of the present disclosure. First to third directions D1 to D3 shown in FIGS. 6A to 6D are identical to those defined with reference to FIGS. 5A to 5D.

Referring to FIG. 6A, a common source line 141 may be formed on a substrate 101 including a logic circuit 130.

The substrate 101 may be configured identically to the substrate 51 described with reference to FIG. 5B.

The logic circuit 130 may include transistors 110 disposed in an active region of the substrate 101, which is defined by an isolation layer 103. Each of the transistors 110 may include a gate insulating layer 107, a gate electrode 109, and junction regions 105a and 105b as described with reference to FIG. 5B.

The logic circuit 130 may include interconnection structures 120 connected to the transistors 110. Each of the interconnection structures 120 may include multi-layered conductive patterns 121, 123, 125, and 127. The substrate 101 including the logic circuit 130 may be covered by an insulating structure 135 including multi-layered insulating layers.

The common source line 141 may be formed over the logic circuit 130 covered by the insulating structure 135. The common source line 141 may include a doped semiconductor layer. The doped semiconductor layer may include a conductivity type dopant. The conductivity type dopant may include an n-type dopant for junctions. The conductivity type dopant may include a counter-doped p-type dopant.

Subsequently, a memory cell array may be formed on the common source line 141. The memory cell array may include a gate stack structure 150, channel structures 160 penetrating the gate stack structure 150, and a memory layer 163 surrounding a sidewall of each of the channel structures 160. The gate stack structure 150 may include interlayer insulating layers 151 and conductive patterns 153, which are alternately stacked on the common source line 141.

The step of forming the memory cell array may include a step of alternately stacking first material layers and second material layers one layer by one layer on the common source line 141, a step of forming holes 161 penetrating the first material layers and the second material layers, a step of forming the memory layer 163 on a sidewall of each of the holes 161, and a step of forming the channel structures 160 filling the holes 161. The memory layer 163 may include a blocking insulating layer BI, a data storage layer DS, and a tunnel insulating layer TI as described with reference to FIG. 5C.

In an embodiment, the step of forming the channel structures 160 may include a step of forming a channel layer 165 on the memory layer 163, a step of forming a core insulating layer 167 on the channel layer 165 opened by a central region of each of the holes 161, a step of removing a core insulating layer 167, and a step of forming a doped semiconductor layer 169 on the opened channel layer 165 by removing the portion of the core insulating layer 167. The doped semiconductor layer 169 may include a conductivity type dopant. The conductivity type dopant may include an n-type dopant for junctions. The conductivity type dopant may include a counter-doped p-type dopant.

In an embodiment, the step of forming the core insulating layer 167 may be omitted. The step of forming the channel structures 160 may include a step of forming a channel layer filling the central region of the holes 161 on the memory layer 163 and a step of injecting a conductivity type dopant into an upper end of the channel layer.

The channel layer 165 may include a semiconductor material. For example, the channel layer 165 may include silicon.

In an embodiment, the first material layers may be an insulating material for the interlayer insulating layers 151, and the second material layers may be a conductive material for the conductive patterns 153.

In an embodiment, the first material layers may be an insulating material for the interlayer insulating layers 151, and the second material layers may be a sacrificial material having an etching rate different from that of the interlayer insulating layers 151. The step of forming the memory cell array may further include a step of replacing the second material layers with the conductive patterns 153.

In an embodiment, the second material layers may be a conductive material for the conductive patterns 153, and the first material layers may be a sacrificial material having an etching rate different from that of the conductive patterns 153. The step of forming the memory cell array may further include a step of replacing the first material layers with the interlayer insulating materials 151.

A mask pattern used as an etch barrier in the step of forming the holes 161 may be removed after the memory cell array is formed, and a region from which the mask pattern is removed may be filled with a first upper insulating layer 171.

Subsequently, a second upper insulating layer 173 covering the channel structures 160 may be formed on the first upper insulating layer 171. The second upper insulating layer 173 may be penetrated by conductive contact plugs 175. In an embodiment, the step of forming the contact plugs 175 may include a step of forming contact holes that penetrate the second upper insulating layer 173 and expose the channel structures 160, a step of filling the contact holes with a conductive material, and a step of planarizing a surface of the conductive material such that the second upper insulating layer 173 is exposed. The contact plugs 175 may be respectively connected to the channel structures 160.

Subsequently, a third upper insulating layer 177 penetrated by bit lines 179 may be formed on the second upper insulating layer 173. In an embodiment, the bit lines 179 may be formed using a damascene process. The bit lines 179 may be formed of various conductive materials.

Subsequently, a fourth upper insulating layer 183 may be formed on the third upper insulating layer 177. An etch stop layer 181 may be formed before the fourth upper insulating layer 183 is formed.

Figure 6B:
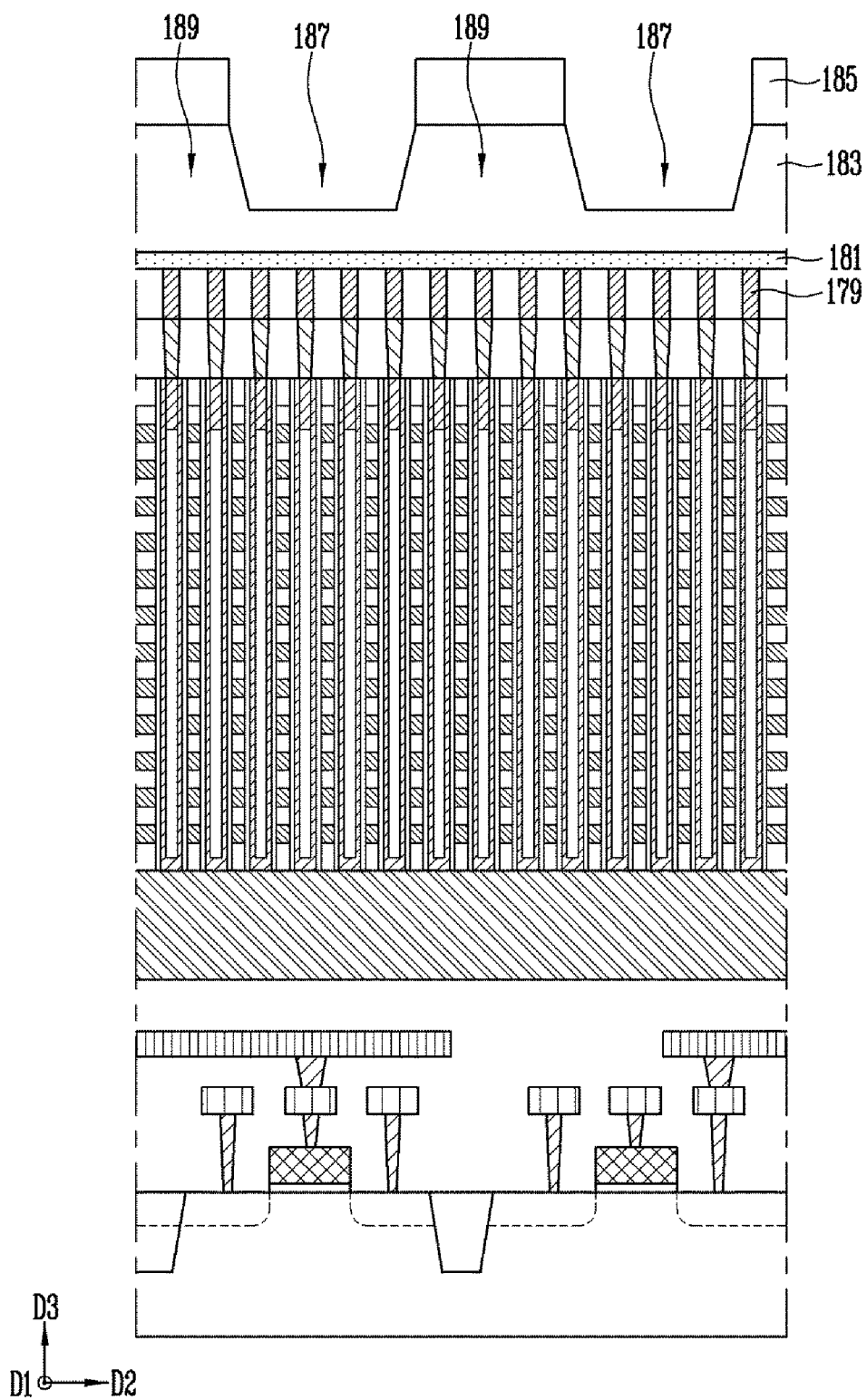

Referring to FIG. 6B, a mask pattern 185 may be formed on the fourth upper insulating layer 183. The mask pattern 185 may be a photoresist pattern formed using a photolithography process.

Subsequently, a depression part 187 may be formed in the fourth upper insulating layer 183 through an etching process using the mask pattern 185 as an etch barrier. Protrusion part 189 of the fourth upper insulating layer 183 may be defined at both sides of the depression part 187. The depression part 187 and the protrusion parts 189 may overlap with the bit lines 179.

Figure 6C:
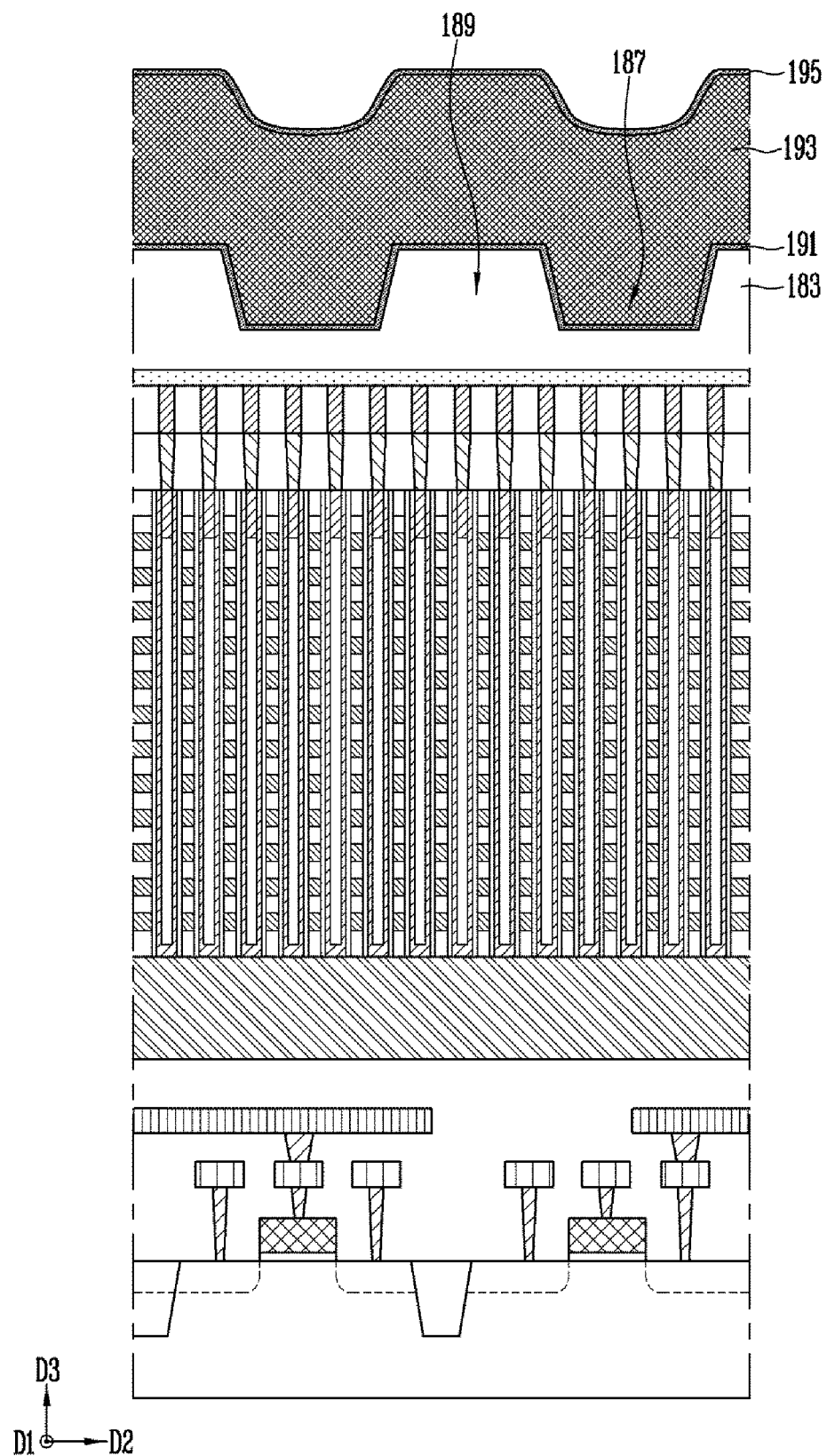

Referring to FIG. 6C, the mask pattern 185 shown in FIG. 6B is removed. Subsequently, at least one conductive layer for a first upper line 190L1 and a second upper line 190L2, which are shown in FIG. 6D, may be formed on the fourth upper insulating layer 183.

In an embodiment, a conductive barrier layer 191, a metal layer 193, and a conductive Anti-Reflective Coating (ARC) layer 195 may be formed on the fourth upper insulating layer 183. The barrier layer 191 may be formed on a surface of the fourth upper insulating layer 183 to prevent direct contact between the metal layer 193 and the fourth upper insulating layer 183. The barrier layer 191 may be formed of a conductive material capable of minimizing a phenomenon by which metal from the metal layer 193 is diffused into the fourth upper insulating layer 183. For example, the barrier layer 191 may include a titanium nitride layer (TiN). The metal layer 193 may be formed through a reflow process such that steps defined along the surface of the fourth upper insulating layer 183 by the protrusion parts 189 and the depression part 187 of the fourth upper insulating layer 183 can be reduced. The metal layer 193 may be a material to which the reflow process can be applied. For example, the metal layer 193 may include aluminum. The ARC layer 195 may be formed of a material capable of preventing reflection in a subsequent exposure process and preventing hillocking of aluminum. For example, ARC layer 195 may include a titanium nitride layer (TiN).

Figure 6D:
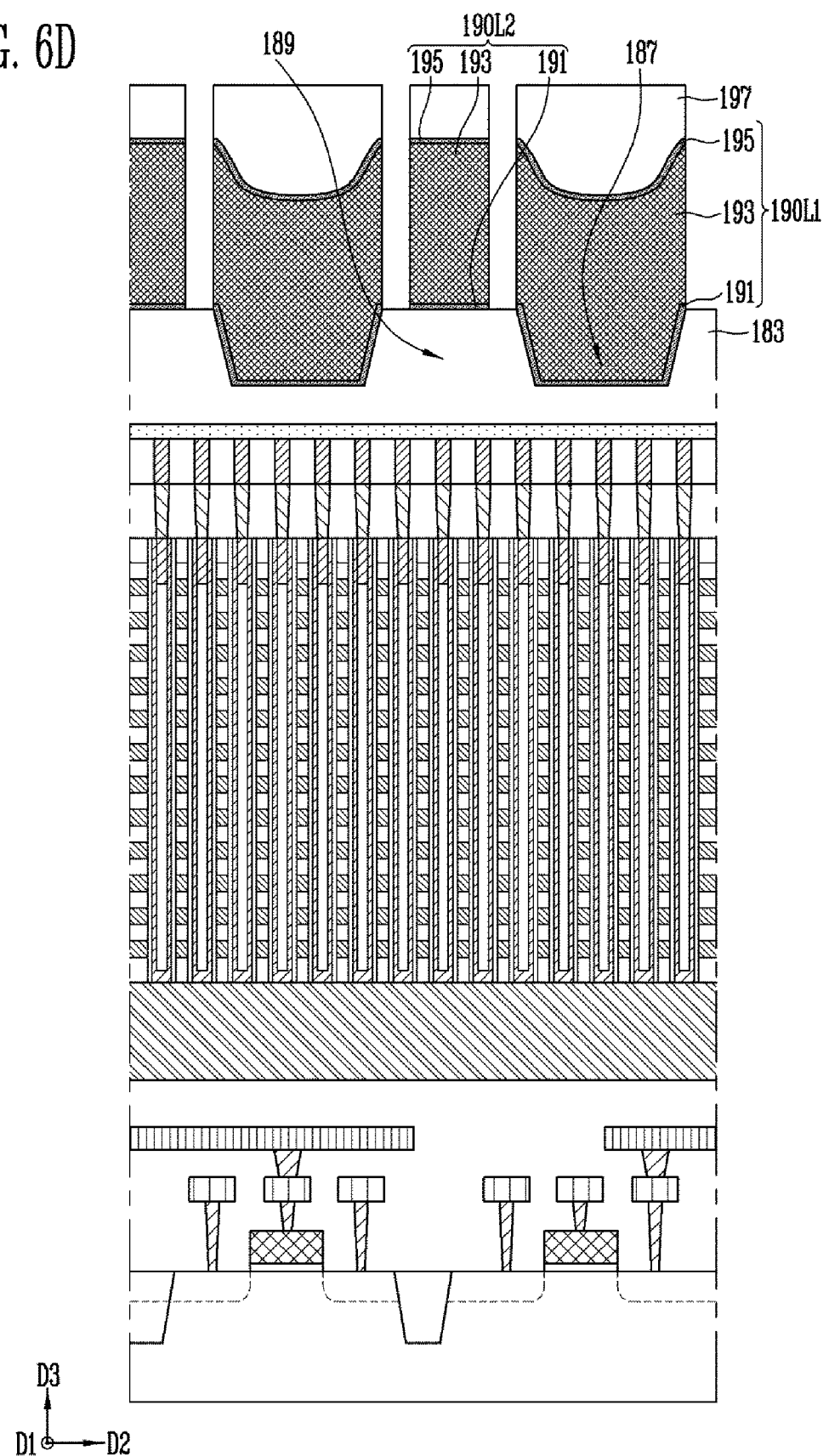

Referring to FIG. 6D, a mask pattern 197 may be formed on the ARC layer 195. The mask pattern 197 may be a photoresist pattern formed using a photolithography process. The photolithography process may include an exposure process. The ARC layer 195 can prevent reflection in the exposure process, and thus shape distortion of the mask pattern 197 can be prevented.

Subsequently, the ARC layer 195, the metal layer 193, and the barrier layer 191 are etched through an etching process using the mask pattern 197 as an etch barrier. Accordingly, the first upper line 190L1 filling the depression part 187 of the fourth upper insulating layer 183 and the second upper line 190L2 overlapping with the protrusion part 189 of the fourth upper insulating layer 183 may be formed. Subsequently, the mask pattern 197 is removed, so that the semiconductor memory device described with reference to FIG. 5B can be formed.

Figure 7:
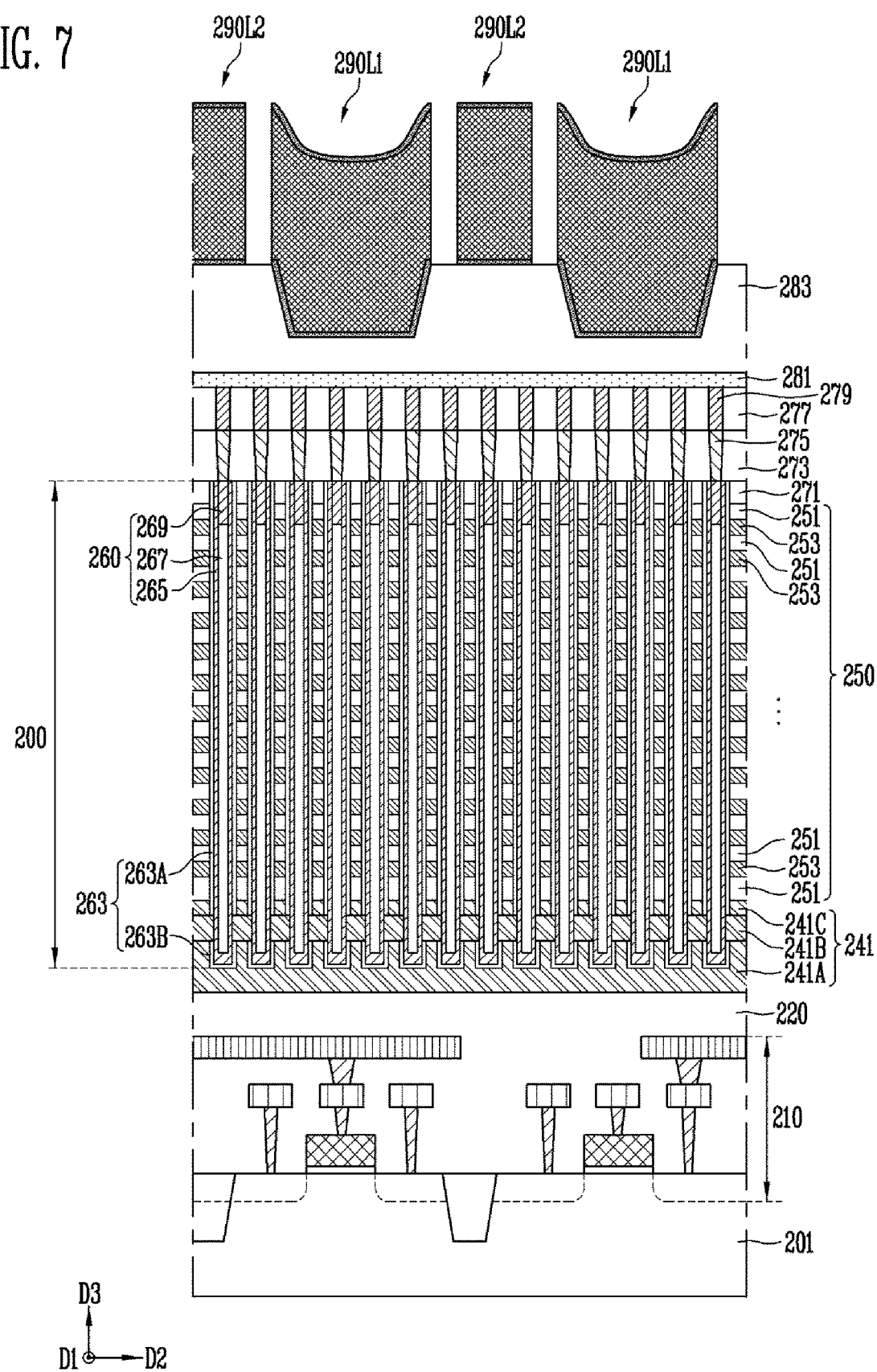
FIGS. 7 and 8 are sectional views illustrating semiconductor memory devices in accordance with various embodiments of the present disclosure.
Figure 8:
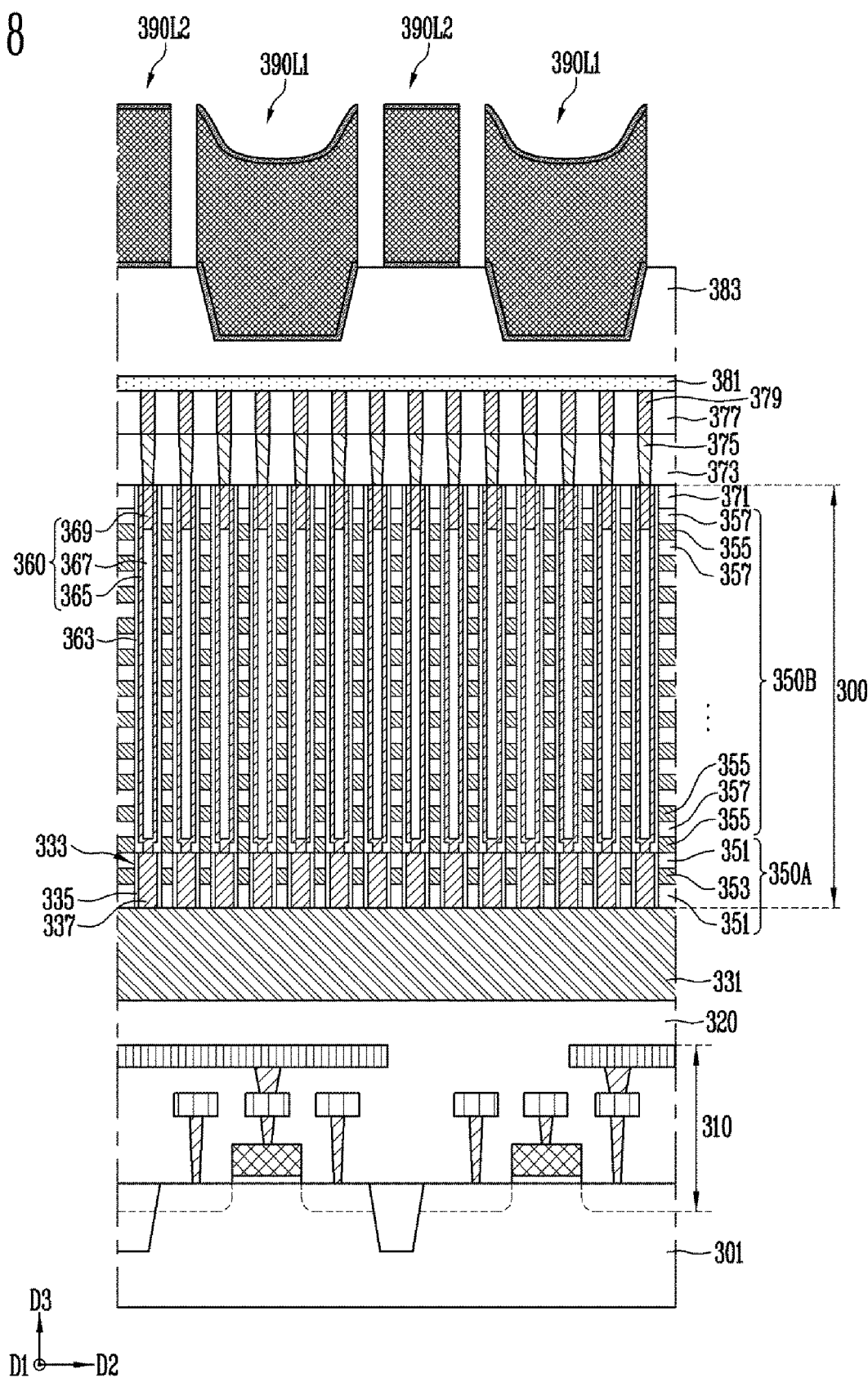

FIGS. 7 and 8 are sectional views illustrating semiconductor memory devices in accordance with various embodiments of the present disclosure. First to third directions D1 to D3 shown in FIGS. 7 and 8 are identical to those defined with reference to FIGS. 5A to 5D.

Referring to FIGS. 7 and 8, each of the semiconductor memory devices may include a substrate 201 or 301 including a logic circuit 210 or 310, a common source line 241 or 331 disposed on the substrate 201 or 301, bit lines 279 or 379 disposed on the common source line 241 or 331, and a memory cell array 200 or 300 connected to the bit lines 279 or 379 and the common source line 241 or 331. Also, each of the semiconductor memory devices may include a first upper line 290L1 or 390L1 and a second upper line 290L2 or 390L2, which overlap with the bit lines 279 or 379.

The substrate 201 or 301 may be configured identically to the substrate 51 described with reference to FIG. 5B. The logic circuit 210 or 310 may be configured identically to the logic circuit LC described with reference to FIG. 5B.

The logic circuit 210 or 310 may be covered by an insulating structure 220 or 320 disposed on the substrate 201 or 301. The insulating structure 220 or 320 may include multi-layered insulating layers.

The common source line 241 or 331 may include a doped semiconductor layer. The doped semiconductor layer for the common source line 241 or 331 may include a conductivity type dopant. The conductivity type dopant may include an n-type dopant for junctions. The conductivity type dopant may include a counter-doped p-type dopant.

The memory cell array 200 or 300 may be formed in various structures.

FIG. 7 illustrates a memory cell array 200 in accordance with an embodiment of the present disclosure.

Referring to FIG. 7, the memory cell array 200 may include a gate stack structure 250 disposed on a common source line 241, channel structures 260 that penetrate the gate stack structure 250 and extend to the inside of the common source line 241, and a memory layer 263 extending along a surface of each of the channel structures 260.

The gate stack structure 250 may include interlayer insulating layers 251 and conductive patterns 253, which are alternately stacked on the common source line 241. The conductive patterns 253 may be used as a source select line, word lines, and a drain select line as described with reference to FIG. 5B.

Each of the channel structures 260 may include a channel layer 265, a core insulating layer 267, and a doped semiconductor layer 269 as described with reference to FIGS. 5B and 5C. In another embodiment, the core insulating layer 267 may be omitted, and each of the channel structures 260 may include an embedded type channel layer embedded in a central region thereof.

Each of the channel structures 260 may include a sidewall in direct contact with the common source line 241. The common source line 241 may include a first semiconductor layer 241A, a second semiconductor layer 241B, and a third semiconductor layer 241C. In an embodiment, the third semiconductor layer 241C may be omitted. Each of the first to third semiconductor layers 241A to 241C may include silicon. The first semiconductor layer 241A may include at least one of an undoped semiconductor layer and a doped semiconductor layer. The second semiconductor layer 241B may include a doped semiconductor layer. The third semiconductor layer 241C may include at least one of an undoped semiconductor layer and a doped semiconductor layer.

The first semiconductor layer 241A may surround a lower end of each of the channel structures CH. The second semiconductor layer 241B may be disposed on the first semiconductor layer 241A, and be in direct contact with the sidewall of each of the channel structures 260. The third semiconductor layer 241C may be stacked on the second semiconductor layer 241B, and be penetrated by the channel structures 260.

The memory layer 263 may include a tunnel insulating layer TI, a data storage layer DS, and a blocking insulating layer BI as described with reference to FIG. 5C. The memory layer 263 may be separated into a first memory pattern 263A and a second memory pattern 263B by the second semiconductor layer 241B. The first memory pattern 263A may extend along a sidewall of a first part of each of the channel structures 260, which penetrates the gate stack structure 250 and the third semiconductor layer 241C. The second memory pattern 263B may be disposed between a second part of each of the channel structures 260, which extends to the inside of the first semiconductor layer 241A, and the first semiconductor layer 241A. A third part of each of the channel structures 260, which is disposed between the first part and the second part, may be surrounded by the second semiconductor layer 241B. The second semiconductor layer 2418 may protrude farther toward each of the channel structures CH than the first and second memory patterns 263A and 263B, and be in direct contact with the third part of each of the channel structures 260.

The gate stack structure 250 may be covered by a first upper insulating layer 271. The first upper insulating layer 271 may be penetrated by the channel structures 260. The channel structures 260 may be connected to bit lines 279 via contact plugs 275.

FIG. 8 illustrates a memory cell array 300 in accordance with another embodiment of the present disclosure.

Referring to FIG. 8, the memory cell array 300 may include a first gate stack structure 350A disposed on a common source line 331, a second gate stack structure 350B disposed on the first gate stack structure 350A, first channel structures 337 penetrating the first gate stack structure 350A, second channel structures 360 penetrating the second gate stack structure 350B, a gate insulating layer 335 surrounding a sidewall of each of the first channel structure 337, and a memory layer 363 surrounding a sidewall of each of the second channel structure 360.

The first gate stack structure 350A may include at least one pair of a first interlayer insulating layer 351 and a first conductive pattern 353. The first conductive pattern 353 may be used as the source select line SSL described with reference to FIG. 3.

Each of the first channel structures 337 may include a doped semiconductor layer. For example, each of the first channel structures 337 may include n-type doped silicon. The gate insulating layer 335 may extend along the sidewall of a channel structure 337 corresponding thereto to open top and bottom surfaces of the corresponding channel structure 337. The first channel structures 337 may be in direct contact with the common source line 331.

The second gate stack structure 350B may include second conductive patterns 355 and second interlayer insulating layers 357, which are alternately stacked on the first gate stack structure 350A. The second conductive patterns 355 may be used as the word lines WL1 to WLn and the drain select line DSL, which are described with reference to FIG. 3.

The second channel structure 360 may be respectively connected to the first channel structures 337. The memory layer 363 may extend along the sidewall of a second channel structure 360 corresponding thereto to open top and bottom surfaces of the corresponding second channel structure 360. The memory layer 363 may include a tunnel insulating layer TI, a data storage layer DS, and a blocking insulating layer BI as described with reference to FIG. 5C.

Each of the second channel structures 360 may include a channel layer 365, a core insulating layer 367, and a doped semiconductor layer 369 as described with reference to FIGS. 5B and 5C. In another embodiment, the core insulating layer 367 may be omitted, and each of the channel structures 360 may include an embedded type channel layer embedded in a central region thereof.

The second gate stack structure 350B may be covered by a first upper insulating layer 371. The first upper insulating layer 371 may be penetrated by the second channel structures 360. The channel layer 365 of each of the second channel structures 360 may be in direct contact with a first channel structure 337 corresponding thereto. The second channel structures 360 may be connected to bit lines 379 via contact plugs 375.

Referring to FIGS. 7 and 8, the bit lines 279 or 379 of each of the semiconductor memory devices may penetrate a third upper insulating layer 277 or 377 covering a second upper insulating layer 273 or 373 and then connected to the contact plugs 275 or 375. The second upper insulating layer 273 or 373 may cover the first upper insulating layer 271 or 371, and be penetrated by the contact plugs 275 or 375.

A fourth upper insulating layer 283 or 383 formed of the same material in the same structure as the fourth upper insulating layer 99 described with reference to FIGS. 5B and 5D may be formed on the third upper insulating layer 277 or 377. An etch stop layer 281 or 381 formed of the same material as described with reference to FIG. 5B may be disposed between the third upper insulating layer 277 or 377 and the fourth upper insulating layer 283 or 383.

A first upper line 290L1 or 390L1 and a second upper line 290L2 or 390L2, which overlap with the bit lines 279 or 379, may be disposed on the fourth upper insulating layer 283 or 383. The first upper line 290L1 or 390L1 and the second upper line 290L2 or 390L2 may be formed in the same layout as the first upper line L1 and the second upper line L2, which are described with reference to FIG. 5A. The first upper line 290L1 or 390L1 and the second upper line 290L2 or 390L2 may be formed of the same materials as the first upper line L1 and the second upper line L2, which are described with reference to FIGS. 5B and 5D. The first upper line 290L1 or 390L1 and the second upper line 290L2 or 390L2 may be formed in the same structure as the first upper line L1 and the second upper line L2, which are described with reference to FIGS. 5B and 5D.

Figure 9:
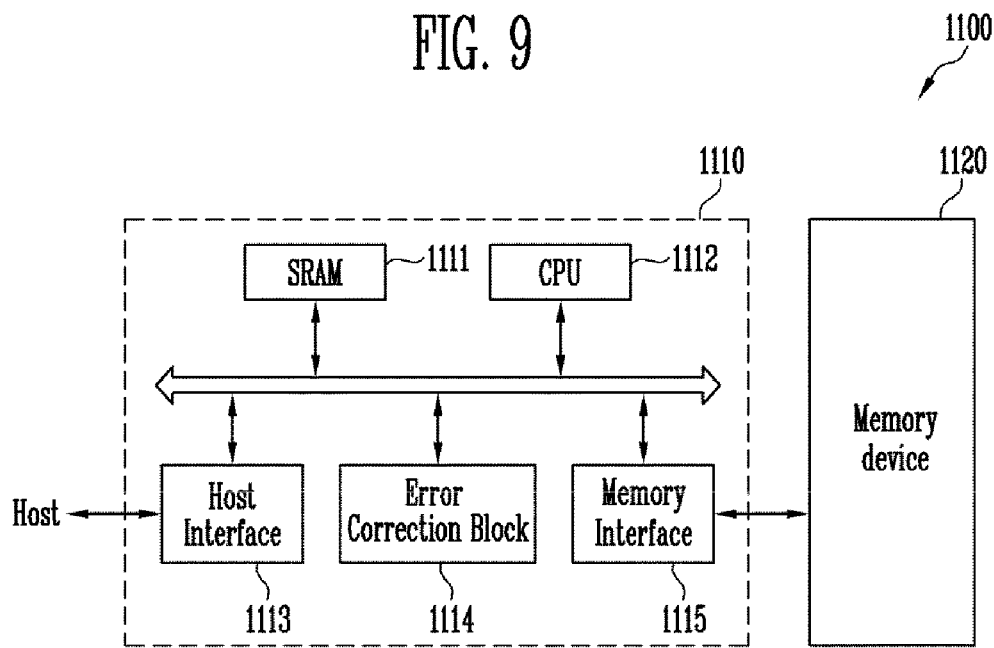
FIG. 9 is a block diagram illustrating a configuration of a memory system in accordance with an embodiment of the present disclosure.

FIG. 9 is a block diagram illustrating a configuration of a memory system 1100 in accordance with an embodiment of the present disclosure.

Referring to FIG. 9, the memory system 1100 includes a memory device 1120 and a memory controller 1110.

The memory device 1120 may be a multi-chip package configured with a plurality of flash memory chips. In an embodiment, the memory device 1120 may include a memory cell array, bit lines connected to the memory cell array, and a first upper line and a second upper line, which overlap with bit lines and are spaced apart from the bit lines at different distances.

The memory controller 1110 is configured to control the memory device 1120. The memory controller 1110 may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 10:
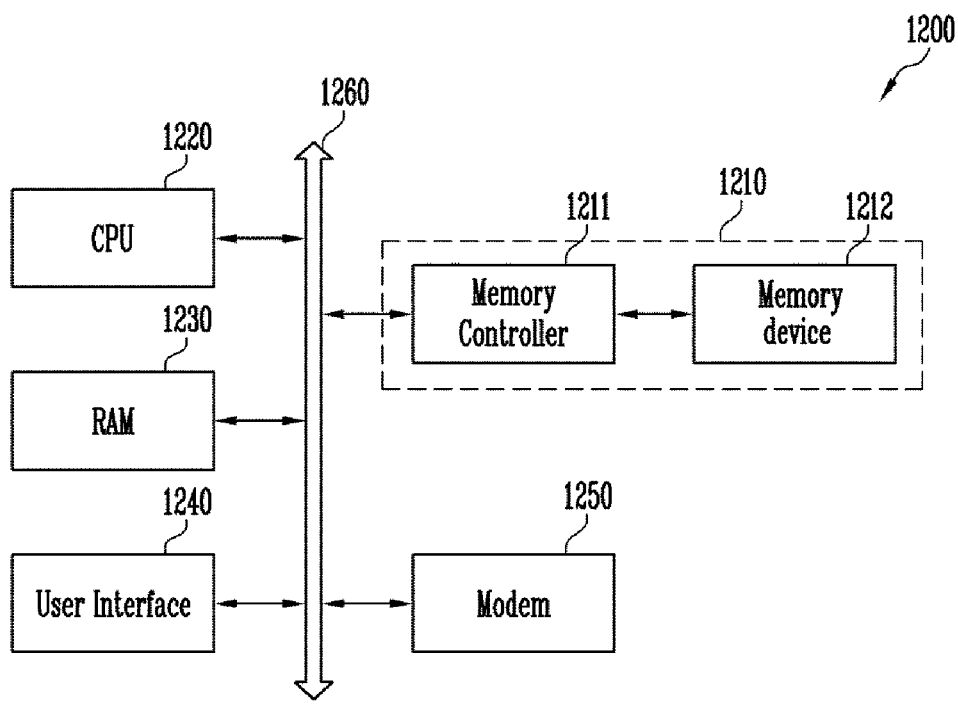
FIG. 10 is a block diagram illustrating a configuration of a computing system in accordance with an embodiment of the present disclosure.

FIG. 10 is a block diagram illustrating a configuration of a computing system 1200 in accordance with an embodiment of the present disclosure.

Referring to FIG. 10, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may include a memory device 1212 and a memory controller 1211.

In accordance with the present disclosure, the thickness of an insulating layer between bit lines and upper lines overlapping the bit lines is controlled to be partially thin, so that capacitance between some of the upper lines and the bit lines can be increased.

In accordance with the present disclosure, an erase voltage applied to some of the upper lines, which are disposed relatively close to the bit lines, can be transmitted to the bit lines by using capacitive coupling between the some of the upper lines and the bit lines. Accordingly, erase efficiency can be improved by generating a Gate Induced Drain Leakage (GIDL) current in an end portion of a memory string adjacent to the bit lines during an erase operation.

What is claimed is:

1. A semiconductor memory device comprising:
a common source line formed on a substrate;
a memory cell array formed on the common source line;
bit lines connected to the memory cell array;
an insulating layer extending to overlap with the bit lines, the insulating layer including a first region and a second region, wherein a thickness of the insulating layer in the first region is thinner than a thickness of the insulating layer in the second region;
a first upper line overlapping with the first region of the insulating layer; and
a second upper line overlapping with the second region of the insulating layer.

2. The semiconductor memory device of claim 1, wherein the first upper line is configured to transmit an erase voltage, and the second upper line is configured to transmit a ground voltage.

3. The semiconductor memory device of claim 1, wherein a width of the first upper line is wider than a width of the second upper line.

4. The semiconductor memory device of claim 1, wherein the first upper line is configured to transmit an erase voltage applied to the first upper line to the bit lines through capacitive coupling.

5. The semiconductor memory device of claim 1, wherein the memory cell array comprises:
a gate stack structure including interlayer insulating layers alternately stacked with conductive patterns; and
channel structures penetrating the gate stack structure, the channel structures being connected to the common source line,
wherein each of the channel structures is connected to a corresponding bit line among the bit lines.

6. The semiconductor memory device of claim 5, wherein the common source line comprises a contact region which does not overlap with the gate stack structure.

7. The semiconductor memory device of claim 6, further comprising a conductive source contact structure extending toward the first upper line from the contact region of the common source line.

8. The semiconductor memory device of claim 1, wherein the substrate comprises a peripheral circuit and an internal voltage generator for providing internal voltages to the peripheral circuit, and
wherein the peripheral circuit includes a source line driver for at least one of providing an erase voltage to the common source line and discharging the common source line.

9. The semiconductor memory device of claim 8, wherein the first upper line connects the common source line to the source line driver, and
the second upper line connects the internal voltage generator to the peripheral circuit.

10. The semiconductor memory device of claim 1, wherein each of the first upper line and the second upper line extend in a zigzag form along an extending direction of the bit lines.

11. A semiconductor memory device comprising:
a common source line formed on a substrate;
a memory cell array formed on the common source line;
bit lines connected to the memory cell array;
an insulating layer extending to overlap with the bit lines;
a first upper line formed on the insulating layer; and
a second upper line formed on the insulating layer, the second upper line being spaced farther apart from the bit lines than the first upper line.

12. The semiconductor memory device of claim 11, wherein the insulating layer includes a depression part into which the first upper line is inserted and a protrusion part supporting the second upper line.

13. The semiconductor memory device of claim 11, wherein the first upper line is configured to transmit an erase voltage, and the second upper line is configured to transmit a ground voltage.

14. The semiconductor memory device of claim 11, wherein a width of the first upper line is wider than a width of the second upper line.

15. The semiconductor memory device of claim 11, wherein the first upper line is configured to transmit an erase voltage applied to the first upper line to the bit lines through capacitive coupling.

16. The semiconductor memory device of claim 11, wherein the memory cell array comprises:
a gate stack structure including interlayer insulating layers alternately stacked with conductive patterns; and
channel structures penetrating the gate stack structure, the channel structures being connected to the common source line,
wherein each of the channel structures is connected to a corresponding bit line among the bit lines.

* * * * *